United States Patent
Gwon et al.

(10) Patent No.: US 12,195,837 B2
(45) Date of Patent: Jan. 14, 2025

(54) CUTTING TOOL WITH HARD COATING FILM FORMED THEREON

(71) Applicant: KORLOY INC., Seoul (KR)

(72) Inventors: Jin-han Gwon, Cheongju-si (KR);
Je-hun Park, Cheongju-si (KR);
Seung-su Ahn, Cheongju-si (KR)

(73) Assignee: KORLOY INC., Seoul (KR)

( * ) Notice: Subject to any disclaimer, the term of this patent is extended or adjusted under 35 U.S.C. 154(b) by 344 days.

(21) Appl. No.: 17/771,879

(22) PCT Filed: Sep. 29, 2020

(86) PCT No.: PCT/KR2020/013425
§ 371 (c)(1),
(2) Date: Apr. 26, 2022

(87) PCT Pub. No.: WO2021/125516
PCT Pub. Date: Jun. 24, 2021

(65) Prior Publication Data
US 2022/0371100 A1 Nov. 24, 2022

(30) Foreign Application Priority Data
Dec. 20, 2019 (KR) .................. 10-2019-0172180

(51) Int. Cl.
*C23C 14/02* (2006.01)
*C23C 14/06* (2006.01)
*C23C 14/08* (2006.01)

(52) U.S. Cl.
CPC ........ *C23C 14/022* (2013.01); *C23C 14/0641* (2013.01); *C23C 14/081* (2013.01); *B23B 2226/125* (2013.01)

(58) Field of Classification Search
None
See application file for complete search history.

(56) References Cited

U.S. PATENT DOCUMENTS

| | | | |
|---|---|---|---|
| 2008/0131677 A1* | 6/2008 | Reineck | C23C 28/42 428/216 |
| 2012/0269589 A1 | 10/2012 | Igarashi et al. | |
| 2016/0008891 A1* | 1/2016 | Makino | C23C 30/005 407/119 |

FOREIGN PATENT DOCUMENTS

| | | |
|---|---|---|
| JP | 09-192906 X | 7/1997 |
| JP | 2016-187847 | 11/2016 |

(Continued)

OTHER PUBLICATIONS

Bobzin—Al2O3 Thin Films for Application in Cutting—Adv. Eng. Mat. vol. 11—2009 (Year: 2009).*

(Continued)

*Primary Examiner* — John Vincent Lawler
(74) *Attorney, Agent, or Firm* — LEX IP MEISTER, PLLC

(57) ABSTRACT

The present invention relates to a cutting tool consisting of a hard base material, such as cemented carbide, cermet, ceramic, and cubic boron nitride, and a hard coating film formed on the hard base material. In the cutting tool according to the present invention, the hard coating film, which is composed of a monolayer or multilayer structure, is formed on a base material, wherein the hard coating film comprises a layer composed of an oxide, wherein in the layer composed of an oxide, the oxygen content of an edge center of the cutting tool is higher than the oxygen content in an area distanced from the edge center by 50 μm or more.

6 Claims, 1 Drawing Sheet

(56) References Cited

FOREIGN PATENT DOCUMENTS

| | | | |
|---|---|---|---|
| JP | 2016187847 A | * 11/2016 | ............. B23B 27/14 |
| KR | 10-2011-0078462 | 7/2011 | |
| KR | 10-2019-0028503 | 3/2019 | |

OTHER PUBLICATIONS

Okuyama—JP 2016-187847 A—PCT D1+CN D1—MT—ceramic coating—2016 (Year: 2016).*

* cited by examiner

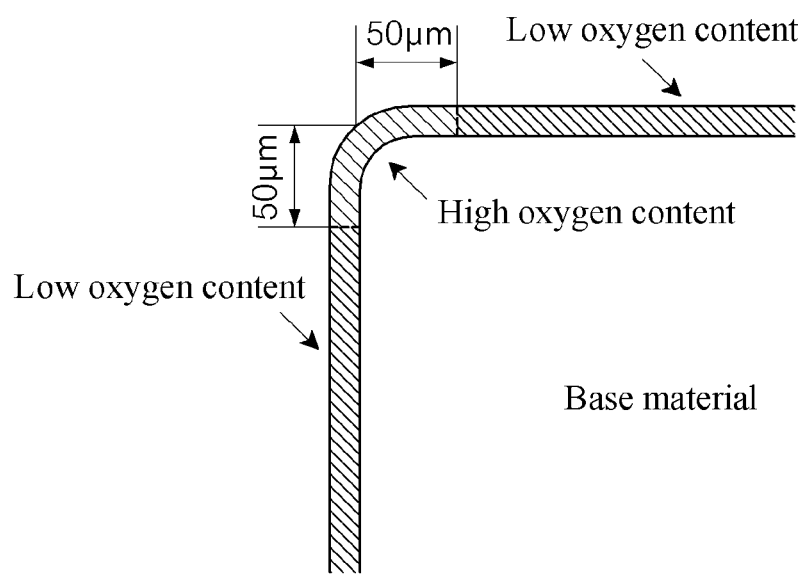

CUTTING TOOL WITH HARD COATING FILM FORMED THEREON

CROSS-REFERENCE TO RELATED APPLICATIONS

This U.S. Non-provisional patent application claims priority under 35 U.S.C. § 119 of Korean Patent Application No. 10-2019-0172180, filed on Dec. 20, 2019, the entire contents of which are hereby incorporated by reference.

TECHNICAL FIELD

The present invention relates to a cutting tool with a hard coating film formed on a hard base material such as cemented carbide, cermet, ceramic, and cubic boron nitride, and more particularly, to a cutting tool with a hard coating film formed on a hard base material, which has a monolayer structure of an oxide layer having a cubic gamma phase or a hexagonal alpha phase or a multilayer structure including an oxide layer.

BACKGROUND ART

During high-speed machining of a hard material, an edge of a cutting tool is exposed to an environment having a high temperature of about 1000° C., worn due to friction and oxidation caused by contact with a workpiece, and also receives mechanical impact such as intermittence. Thus, the cutting tool is essentially required to have proper wear resistance and toughness.

In order to apply the wear resistance and toughness required for the cutting tool, a hard coating film is generally formed on a surface of cemented carbide used for the cutting tool through chemical vapor deposition (hereinafter, referred to as 'CVD') or physical vapor deposition (hereinafter, referred to as 'PVD').

The hard coating film includes a monolayer or multilayer non-oxide based coating film (e.g., TiN, TiC, TiCN), an oxide based coating film (e.g., $Al_2O_3$) having excellent oxidation resistance, or a mixed layer thereof. The non-oxide based coating film may include, e.g., carbide, nitride, and carbonitride of groups 4, 5, and 6 metal elements on the periodic table such as TiN, TiC, and TiCN, and the oxide based coating film may include, e.g., alpha-$Al_2O_3$ or gamma-$Al_2O_3$.

Also, the cutting tool has required roles and properties that are slightly different based on regions contacting a workpiece. For example, a rake face generally requires oxidation resistance, wear resistance, and welding resistance, the edge requires oxidation resistance, thermal crack resistance, and delamination resistance, and a flank face requires wear resistance.

In order to appropriately satisfy the properties required differently for each region of the cutting tool, although a multi-component coating film containing various components, a multilayer coating film including different material layers, or a post-machining technology is applied, the above-described technologies may not differentiate the properties for each region of the tool.

DISCLOSURE OF THE INVENTION

Technical Problem

The present invention provides a cutting tool having an extended life span by differently adjusting an oxygen content of a hard coating film formed on each region of the cutting tool to have properties required for each of an edge, a rake face, and a flank face.

Technical Solution

In order to achieve the objects, a cutting tool with a hard coating film formed thereon has a structure in which the hard coating film composed of a monolayer or multilayer structure is formed on a base material of the cutting tool, the hard coating film includes a layer composed of oxide, and an oxygen content of a center of an edge of the cutting tool is higher than that of an area spaced by 50 μm or more from the center of the edge of the cutting tool.

Advantageous Effects

In case of the cutting tool according to the present invention, as the rake face or the flank face has the oxygen content less than that of the edge, the rake face or the flank face has the high hardness and the improved wear resistance, and the edge has the oxidation resistance and the thermal crack resistance through the increased oxygen content.

BRIEF DESCRIPTION OF THE DRAWINGS

FIG. 1 is a schematic view illustrating a structure of a hard coating film according to the present invention.

MODE FOR CARRYING OUT THE INVENTION

Hereinafter, embodiments of the present invention will be described in detail with reference to the accompanying drawings.

The present invention may, however, be embodied in different forms and should not be construed as limited to the embodiments set forth herein. Rather, these embodiments are provided so that this disclosure will be thorough and complete, and will fully convey the scope of the present invention to those skilled in the art.

A cutting tool with a hard coating film formed thereon according to the present invention is characterized in that the hard coating film having a monolayer or multilayer structure is formed on a base material of the cutting tool, the hard coating film includes a layer composed of oxide, and an oxygen content of an edge center of the cutting tool is higher than an oxygen content of an area spaced by 50 μm or more from the edge center in the layer composed of oxide.

FIG. 1 is a schematic view illustrating a structure of the hard coating film according to the present invention. As illustrated in FIG. 1, a coating film composed of oxide is formed on a surface of the base material, and in the coating film, an area (a region with a wide hatch spacing) within about 50 μm from a center of an edge (a bent region in the base material) toward a rake face or a flank face has an oxygen content relatively greater than that of the rest region (a region with a narrow hatch spacing).

Here, the area (the region with the wide hatch spacing) within about 50 μm from the center of the edge (the bent region in the base material) toward the rake face or the flank face may have a uniform oxygen content, or the oxygen content may continuously or intermittently decreases in a direction toward the rake face or the flank face from the center.

When the oxygen content of each of the edge and the rake face or the flank face is relatively differently controlled as described above, the rake face or the flank face may have a small oxygen content relative to that of the edge to have high hardness and improved wear resistance, and the edge may have a high oxygen content to have oxidation resistance and thermal crack resistance.

Also, in the layer composed of oxide, when an oxygen content difference between the center of the edge of the cutting tool and the area spaced by 50 μm or more from the center of the edge is less than 5 at %, the edge and the rake face or the flank face may not have a sufficient property difference, and when the oxygen content difference is greater than 15 at %, the edge may have a reduced wear resistance. Thus, the oxygen content difference may preferably maintain 5 at % to 15 at %.

Also, the coating film may be made of oxide containing at least one selected from Al, Cr, Ti, Y, V, W, Ta, Nb, Mo, Zr, Hf and Si.

Also, when the coating film has a small thickness less than 0.01 μm, oxidation resistance required during cutting may not be secured, and when the coating film has a thickness greater than 5 μm, as a residual stress increases, delamination and chipping may be easily generated, and as conductivity of the coating film is remarkably reduced, a density and a bonding force of the coating film are reduced when the films are deposited. Thus, the coating film may have the thickness in a range from 0.01 μm to 5 μm, preferably in a range from 0.01 μm to 3 μm, more preferably in a range from 0.01 μm to 1 μm.

Also, at least one layer of a compound layer selected from carbide, nitride, oxide, carbonitride, oxynitride, oxycarbide, carbon oxynitride, boride, boron nitride, boron carbide, boron carbonitride, boron oxynitride, boron oxycarbide, boron carbon oxynitride and boron oxynitride, each of which contains at least one of Al, Cr, Ti, Y, V, W, Ta, Nb, Mo, Zr, Hf and Si, may be additionally formed above and/or below the coating layer composed of oxide.

Also, the coating layer composed of oxide may be made of, e.g., $Al_2O_3$ having a cubic gamma phase or a hexagonal alpha phase.

Embodiment

Hard Coating Film Manufacturing

In an embodiment of the present invention, a coating film composed of oxide is formed on the surface of the hard base material composed of a sintered material such as cemented carbide, cermet, ceramic and cubic boron nitride by using a magnetron sputtering that is physical vapor deposition (PVD), and a coating film having a multilayer including the coating film composed of oxide is formed through a hybrid PVD process that simultaneously applies arc ion plating.

Specifically, the base material is cleaned with ultra-pure water and wet micro-blasting and then mounted in a dried state at a position spaced a predetermined distance in a radial direction from a central axis on the rotation table in a coating furnace along a circumference of the rotation table. Ion bombardment is performed for 30 minutes to 60 minutes by decompressing an initial vacuum pressure in the coating furnace equal to or less than a pressure of $8.5 \times 10^{-5}$ Torr and applying a pulse bias voltage of −200 V to −300 V to the base material rotating itself while rotating on the rotation table under argon (Ar) gas atmosphere after heating at a temperature of 400° C. to 600° C. A gas pressure for coating is maintained equal to or less than 50 mTorr, desirably equal to or less than 40 mTorr, and a bias voltage during coating is applied at a voltage of −100 V to −150 V in case of oxide film coating and at a voltage of −20 V to −100 V in case of nitride film coating. The above-described coating condition may be varied according to equipment features and conditions.

More specifically, the base material composed of cemented carbide having a Co content of 10 wt % and a mean grain size (WC) of 0.8 μm. The oxide coating film is composed of $Al_2O_3$ and formed under a condition in which a bias voltage of −125 V (pulsed DC, 20 kHz to 45 kHz), a sputter power of 20 kW, an input reaction gas of $O_2$ and Ar, and a pressure of 0.5 Pa by using a target of Al having 99.9 at %. Here, an embodiment of the present invention is configured by applying a pulse duty cycle of the bias voltage to be less than 50%, and a comparative example of the present invention is configured by applying a pulse duty cycle of the bias voltage to be equal to or greater than 50%. Also, when a multilayer structure including the coating film composed of oxide is formed, a AlTiN or AlCrN nitride film is applied instead of a $Al_2O_3$, and the film is formed under a condition in which a bias voltage of −30V to −60V, an arc current of 100 A to 150 A, an input reaction gas of N2, and a pressure of 2.7 Pa to 4.0 Pa by using a AlTi (60 at %/40 at %) target or a AlCr (64 at %/36 at %) target.

The embodiment and the comparative example of the present invention are manufactured under the above-described condition, and basic information including a structure, a thickness, and hardness of the hard coating film is shown in table 1 below.

TABLE 1

| Classification | No. | Structure of coating film | Thickness of coating film (μm) | Total thickness (mm) | Hardness of coating film (GPa) |
| --- | --- | --- | --- | --- | --- |
| Embodiment | 1-1 | $Al_2O_3$ | 0.8 | 0.8 | 28.0 |
| | 1-2 | $AlTiN/Al_2O_3$ | 0.4 | 2.8 | 31.5 |
| | 1-3 | $AlTiN/Al_2O_3/AlTiN$ | 0.4 | 3.1 | 31.9 |
| | 1-4 | $AlCrN/Al_2O_3$ | 0.4 | 3.0 | 30.1 |
| | 1-5 | $AlCrN/Al_2O_3/AlCrN$ | 0.4 | 3.0 | 31.8 |
| Comparative example | 2-1 | $Al_2O_3$ | 0.9 | 0.9 | 26.9 |
| | 2-2 | $AlTiN/Al_2O_3$ | 0.4 | 3.0 | 30.4 |
| | 2-3 | $AlTiN/Al_2O_3/AlTiN$ | 0.4 | 2.9 | 32.3 |
| | 2-4 | $AlCrN/Al_2O_3$ | 0.4 | 3.0 | 29.8 |
| | 2-5 | $AlCrN/Al_2O_3/AlCrN$ | 0.4 | 3.1 | 31.0 |

Analysis Result of Oxygen Content of Hard Coating Film

Table 2 below shows a result obtained by analyzing an oxygen content in an oxide film in an area spaced by 50 μm from a center of an edge and an oxygen content of an oxide film in a center of an edge of a cutting tool of samples of the embodiment and the comparative example through energy-disperse X-ray spectroscopy (EDX). Here, a general tool has a rake face disposed in a direction parallel to a target and a flank face disposed in a direction perpendicular to the target, and this may be changed according to a shape of the tool or a method of mounting the tool to a rotation table. Samples 1-3(R), 1-5(R), 2-3(R), and 2-5(R) are mounted on the rotation table so that the rake face of the tool is disposed in the direction perpendicular to the target, and the flank face of the tool is disposed in the direction parallel to the target.

TABLE 2

| | | | Oxygen content in oxide film (EDX, at %) | | |
|---|---|---|---|---|---|
| Classification | No. | Structure of coating film | Center of edge | Rake face | Flank face |
| Embodiment | 1-1 | $Al_2O_3$ | 48.9 | 34.7 | 42.9 |
| | 1-2 | $AlTiN/Al_2O_3$ | 46.4 | 32.5 | 40.5 |
| | 1-3 | $AlTiN/Al_2O_3/AlTiN$ | 47.5 | 33.1 | 41.9 |
| | 1-3(R) | $AlTiN/Al_2O_3/AlTiN$ | 50.1 | 42.8 | 33.4 |
| | 1-4 | $AlCrN/Al_2O_3$ | 47.8 | 33.3 | 40.9 |
| | 1-5 | $AlCrN/Al_2O_3/AlCrN$ | 49.0 | 37.8 | 41.8 |
| | 1-5(R) | $AlCrN/Al_2O_3/AlCrN$ | 47.3 | 40.9 | 31.6 |
| Comparative example | 2-1 | $Al_2O_3$ | 43.7 | 37.0 | 41.5 |
| | 2-2 | $AlTiN/Al_2O_3$ | 45.6 | 39.7 | 42.5 |
| | 2-3 | $AlTiN/Al_2O_3/AlTiN$ | 43.9 | 37.2 | 39.8 |
| | 2-3(R) | $AlTiN/Al_2O_3/AlTiN$ | 45.6 | 42.9 | 39.0 |
| | 2-4 | $AlCrN/Al_2O_3$ | 46.4 | 39.9 | 44.2 |
| | 2-5 | $AlCrN/Al_2O_3/AlCrN$ | 46.1 | 40.3 | 43.0 |
| | 2-5(R) | $AlCrN/Al_2O_3/AlCrN$ | 44.5 | 42.1 | 40.0 |

As shown in the table 2 above, in the hard coating film of the embodiment, the oxygen content in the oxide film of the center of the edge of the cutting tool has a value higher by 5 at % to 15 at % than that of the oxygen content in the oxide film in the area (rake face or flank face) spaced by 50 μm from the center of the edge. On the other hand, in the hard coating film of the comparative example, the oxygen content in the oxide film of the center of the edge of the cutting tool has a value higher by 2 at % to 7 at % than that of the oxygen content in the oxide film in the area (rake face or flank face) spaced by 50 μm from the center of the edge. That is, the hard coating film of the embodiment has a significant difference in oxygen content according to positions of the edge of the cutting tool.

Cutting Performance Evaluation

A milling test is performed to evaluate the wear resistance, the thermal crack resistance, and the chipping resistance of the hard coating film manufactured as stated in table 2 and evaluated with conditions below.

In general, carbon steel has a main wear type of chemical friction wear, and a cutting performance is greatly affected by oxidation resistance of the edge. In general, alloy steel has a main wear type of thermal crack and mechanical friction wear, and a cutting performance is greatly affected by a heat shielding property of the edge and hardness of the coating film of the rake face or the flank face. In general, stainless steel has a main wear type of chipping caused by deposition and work hardening of a workpiece, and a cutting performance is greatly affected by oxidation resistance and lubricity of the edge.

(1) Wear Resistance Evaluation
  Workpiece: Carbon steel (SM45C)
  Sample model number: SNMX1206ANN-MM
  Cutting speed: 250 m/min
  Cutting feed: 0.2 mm/tooth
  Cutting depth: 2 mm
(2) Thermal Crack Resistance Evaluation
  Workpiece: Alloy steel (SCM440)
  Sample model number: SNMX1206ANN-MM
  Cutting speed: 200 m/min
  Cutting feed: 0.2 mm/tooth
  Cutting depth: 2 mm
(3) Chipping Resistance Evaluation
  Workpiece: STS316L
  Sample model number: ADKT170608PESR-ML
  Cutting speed: 120 m/min
  Cutting feed: 0.15 mm/tooth
  Cutting depth: 5 mm Results obtained by evaluating with the above-described conditions are shown in table 3 below.

TABLE 3

| | | Wear resistance | | Thermal crack resistance | | Chipping resistance | |
|---|---|---|---|---|---|---|---|
| Classification | No. | Cutting length (mm) | Wear type | Cutting length (mm) | Wear type | Cutting length (mm) | Wear type |
| Embodiment | 1-1 | 900 | Coating film peeling, Excessive wear | 900 | Thermal crack, Fractured | 200 | Boundary chipping |
| | 1-2 | 3000 | Coating film peeling | 1500 | Excessive wear, Thermal crack | 400 | Boundary chipping |
| | 1-3 | 5400 | Normal wear | 5400 | Normal wear | 1100 | Normal wear |
| | 1-3 (R) | 6300 | Normal wear | 4200 | Normal wear | 900 | Normal wear |
| | 1-4 | 2700 | Coating film peeling | 1500 | Excessive wear, Thermal crack | 300 | Boundary chipping |

TABLE 3-continued

| Classification | No. | Wear resistance Cutting length (mm) | Wear type | Thermal crack resistance Cutting length (mm) | Wear type | Chipping resistance Cutting length (mm) | Wear type |
|---|---|---|---|---|---|---|---|
| | 1-5 | 6000 | Normal wear | 5100 | Normal wear | 1200 | Normal wear |
| | 1-5 (R) | 6600 | Normal wear | 3600 | Excessive wear | 1100 | Normal wear |
| Comparative example | 2-1 | 600 | Coating film peeling, Excessive wear | 900 | Thermal crack, Fractured | 100 | Boundary chipping |
| | 2-2 | 2100 | Coating film peeling, Excessive wear | 1200 | Excessive wear, Thermal crack | 300 | Boundary chipping |
| | 2-3 | 3300 | Excessive wear | 2700 | Thermal crack | 600 | Boundary chipping |
| | 2-3 (R) | 3900 | Excessive wear | 1800 | Excessive wear, Thermal crack | 500 | Chipping at R region |
| | 2-4 | 1800 | Coating film peeling, Excessive wear | 1200 | Excessive wear, Thermal crack | 200 | Boundary chipping |
| | 2-5 | 3600 | Excessive wear | 2100 | Thermal crack | 600 | Boundary chipping |
| | 2-5 (R) | 3900 | Excessive wear | 1500 | Excessive wear, Thermal crack | 400 | Chipping at R region |

As shown in table 3 above, samples 1-3, 1-3(R), 1-5, and 1-5(R) of the hard coating film of the embodiment are excellent in wear resistance, thermal crack resistance, and chipping resistance more than the hard coating film of the comparative example.

The hard coating film of the embodiment has a structure in which the center of the edge has excellent lubricity and oxidation resistance relative to the rake face or the flank face due to the high oxygen content of the center of the edge, and the rake face or the flank face has excellent mechanical wear resistance due to the high coating film hardness thereof. Thus, it is determined that the hard coating film of the embodiment has a cutting performance superior to that of the hard coating film of the comparative example in the above milling test because the hard coating film of the embodiment has properties required for each region of the tool more than the hard coating film of the comparative example.

Here, samples 1-1 and 2-1 in which an oxide film has a single layer show a significantly low cutting performance due to low coating film hardness, low bonding force, and low coating film thickness. Also, samples 1-2, 1-4, 2-2, and 2-4 in which an oxide film is laminated on a nitride film show a relatively low cutting performance because the oxide film is quickly consumed during machining due to absence of an outermost layer for protecting the oxide film having low coating film hardness to cause reduction in oxidation resistance and lubricity. Thus, it may be known that samples 1-3, 1-5, 2-3, and 2-5 having a structure in which an oxide film is laminated between nitride films are stable. Here, it may be determined that each of samples 1-3 and 105 has a coating film structure having an improved effect of a cutting performance when oxygen contents are different for each region of the tool.

A hard coating film sample having nitride containing at least one selected from Al, Cr, Ti, Y, V, W, Ta, Nb, Mo, Zr, Hf and Si above and/or below the coating film composed of oxide is additionally manufactured in addition to the above evaluated 14 kinds of samples. The milling test is performed on this sample, and evaluation results are shown in table 4 below.

TABLE 4

| Classification | No. | Structure of coating film | Wear resistance Cutting length (mm) | Thermal crack resistance Cutting length (mm) | Chipping resistance Cutting length (mm) |
|---|---|---|---|---|---|
| Embodiment | 3-1 | AlTiN/Al$_2$O$_3$/AlTiSiN (Al:Ti:Si = 57:38:5) | 7500 | 8400 | 1100 |
| | 3-2 | AlTiN/Al$_2$O$_3$/AlTiVZrN (Al:Ti:V:Zr = 54:36:5:5) | 5700 | 4500 | 1700 |

TABLE 4-continued

| Classification | No. | Structure of coating film | Wear resistance Cutting length (mm) | Thermal crack resistance Cutting length (mm) | Chipping resistance Cutting length (mm) |
|---|---|---|---|---|---|
| | 3-3 | AlTiN/Al$_2$O$_3$/AlTiNbMoN (Al:Ti:Nb:Mo = 54:36:5:5) | 6300 | 6600 | 1100 |
| | 3-4 | AlTiWYN/Al$_2$O$_3$/AlTiN (Al:Ti:W:Y = 56.4:37.6:3:3) | 5400 | 3900 | 900 |
| | 3-5 | AlTiTaHfN/Al$_2$O$_3$/AlTiN (Al:Ti:Ta:Hf = 56.4:37.6:3:3) | 6300 | 7200 | 1600 |
| | 3-6 | AlCrN/Al$_2$O$_3$/AlCrSiN (Al:Cr:Si = 60.8:34.2:5) | 8100 | 6900 | 1100 |
| | 3-7 | AlCrN/Al$_2$O$_3$/AlCrVZrN (Al:Cr:V:Zr = 57.6:32.4:5:5) | 4800 | 3900 | 1900 |
| | 3-8 | AlCrN/Al$_2$O$_3$/AlCrNbMoN (Al:Cr:Nb:Mo = 57.6:32.4:5:5) | 6600 | 5700 | 1100 |
| | 3-9 | AlCrWYN/Al$_2$O$_3$/AlCrN (Al:Cr:W:Y = 60.2:33.8:3:3) | 5400 | 3600 | 1000 |
| | 3-10 | AlCrTaHfN/Al$_2$O$_3$/AlCrN (Al:Cr:Ta:Hf = 60.2:33.8:3:3) | 7800 | 7200 | 1900 |
| Comparative example | 4-1 | AlTiN/Al$_2$O$_3$/AlTiSiN (Al:Ti:Si = 57:38:5) | 3300 | 4200 | 600 |
| | 4-2 | AlTiN/Al$_2$O$_3$/AlTiVZrN (Al:Ti:V:Zr = 54:36:5:5) | 2100 | 1800 | 900 |
| | 4-3 | AlTiN/Al$_2$O$_3$/AlTiNbMoN (Al:Ti:Nb:Mo = 54:36:5:5) | 2700 | 3000 | 500 |
| | 4-4 | AlTiWYN/Al$_2$O$_3$/AlTiN (Al:Ti:W:Y = 56.4:37.6:3:3) | 2100 | 1800 | 300 |
| | 4-5 | AlTiTaHfN/Al$_2$O$_3$/AlTiN (Al:Ti:Ta:Hf = 56.4:37.6:3:3) | 3000 | 2700 | 700 |
| | 4-6 | AlCrN/Al$_2$O$_3$/AlCrSiN (Al:Cr:Si = 60.8:34.2:5) | 3900 | 3900 | 500 |
| | 4-7 | AlCrN/Al$_2$O$_3$/AlCrVZrN (Al:Cr:V:Zr = 57.6:32.4:5:5) | 2100 | 1500 | 1000 |
| | 4-8 | AlCrN/Al$_2$O$_3$/AlCrNbMoN (Al:Cr:Nb:Mo = 57.6:32.4:5:5) | 2700 | 3000 | 400 |
| | 4-9 | AlCrWYN/Al$_2$O$_3$/AlCrN (Al:Cr:W:Y = 60.2:33.8:3:3) | 2100 | 1200 | 400 |
| | 4-10 | AlCrTaHfN/Al$_2$O$_3$/AlCrN (Al:Cr:Ta:Hf = 60.2:33.8:3:3) | 3600 | 4500 | 800 |

As shown in table 4 above, the hard coating film of the embodiment is overall excellent in wear resistance, thermal crack resistance, chipping resistance relative to the hard coating film of the comparative example.

It may be known that the hard coating film having the nitride containing at least one selected from Al, Cr, Ti, Y, V, W, Ta, Nb, Mo, Zr, Hf and Si above and/or below the coating film composed of oxide shows a slightly different cutting performance for each evaluation item according to a composition of the nitride and a laminated position. As described above, the hard coating film designed properly to the machining environment and performance improvement may be achieved through compositional and structural combination of various materials and the coating film composed of oxide of the present invention.

The invention claimed is:

1. A cutting tool with a hard coating film formed thereon, wherein a hard coating film composed of a monolayer or multilayer structure is formed on a based material of the cutting tool,
wherein the hard coating film comprises a layer composed of oxide, and in the layer composed of oxide, an oxygen content of a center of an edge of the cutting tool is greater by 5 at % to 15 at % than that of an area spaced by 50 μm or more from the center of the edge.

2. The cutting tool of claim 1, wherein the coating film comprises at least one selected from Al, Cr, Ti, Y, V, W, Ta, Nb, Mo, Zr, Hf and Si.

3. The cutting tool of claim 1, wherein the coating film has a thickness of 0.01 μm to 5 μm.

4. The cutting tool of claim 1, wherein at least one layer of a compound layer selected from carbide, nitride, oxide, carbonitride, oxynitride, oxycarbide, carbon oxynitride, boride, boron nitride, boron carbide, boron carbonitride, boron oxynitride, boron oxycarbide, boron carbon oxynitride and boron oxynitride, each of which contains at least one of Al, Cr, Ti, Y, V, W, Ta, Nb, Mo, Zr, Hf and Si, is additionally formed above and/or below the coating layer composed of oxide.

5. The cutting tool of claim 1, wherein the coating layer composed of oxide is made of Al$_2$O$_3$ having a cubic gamma phase or a hexagonal alpha phase.

6. The cutting tool of claim 2, wherein the coating film has a thickness of 0.01 μm to 5 μm.

* * * * *